(12) United States Patent
Oishi

(10) Patent No.: US 6,603,316 B2
(45) Date of Patent: Aug. 5, 2003

(54) SEMICONDUCTOR WAFER TEST SYSTEM

(75) Inventor: Hideo Oishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/905,922

(22) Filed: Jul. 17, 2001

(65) Prior Publication Data

US 2002/0005723 A1 Jan. 17, 2002

(30) Foreign Application Priority Data

Jul. 17, 2000 (JP) ....................................... 2000-215312

(51) Int. Cl.⁷ ............................................. H01H 31/12
(52) U.S. Cl. ...................................................... 324/551
(58) Field of Search .......................... 438/14; 365/201; 371/21; 324/551, 548

(56) References Cited

U.S. PATENT DOCUMENTS 5,258,954 A * 11/1993 Furuyama ................... 365/201
5,798,649 A * 8/1998 Smayling et al. ........... 324/551

FOREIGN PATENT DOCUMENTS

JP          07-106386          4/1995

* cited by examiner

Primary Examiner—John F. Niebling
Assistant Examiner—André C Stevenson
(74) Attorney, Agent, or Firm—McDermott, Will & Emery

(57) ABSTRACT

A semiconductor wafer test system for carrying out a burn-in test on a semiconductor wafer including multiple semiconductor devices thereon. A metal interconnect is connected to the gate electrode of each of those devices. A power supply applies an ac voltage of predetermined amplitude to a conductive plate, which creates an ac electric field to be placed on the devices. The ac field should have an intensity at least equal to a minimum value required for the burn-in test and less than a critical value, below which no breakdown occurs in the gate oxide film of each device. By changing the amount of time for which the devices are exposed to the ac field, the burn-in period can be changed freely. In addition, forward and reverse fields are both placed on the gate oxide film of each device. Thus, failures can be screened out very effectively.

10 Claims, 13 Drawing Sheets

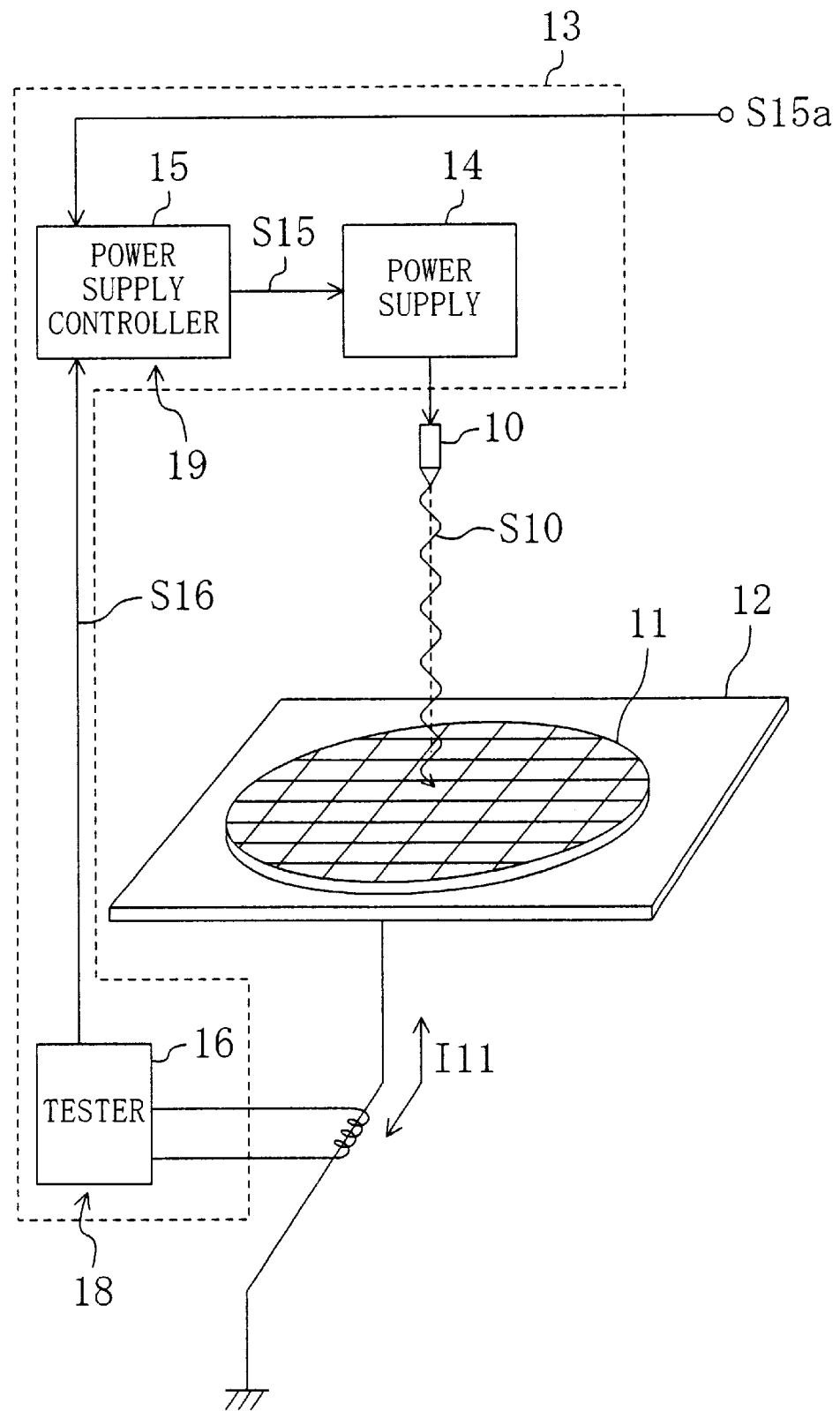

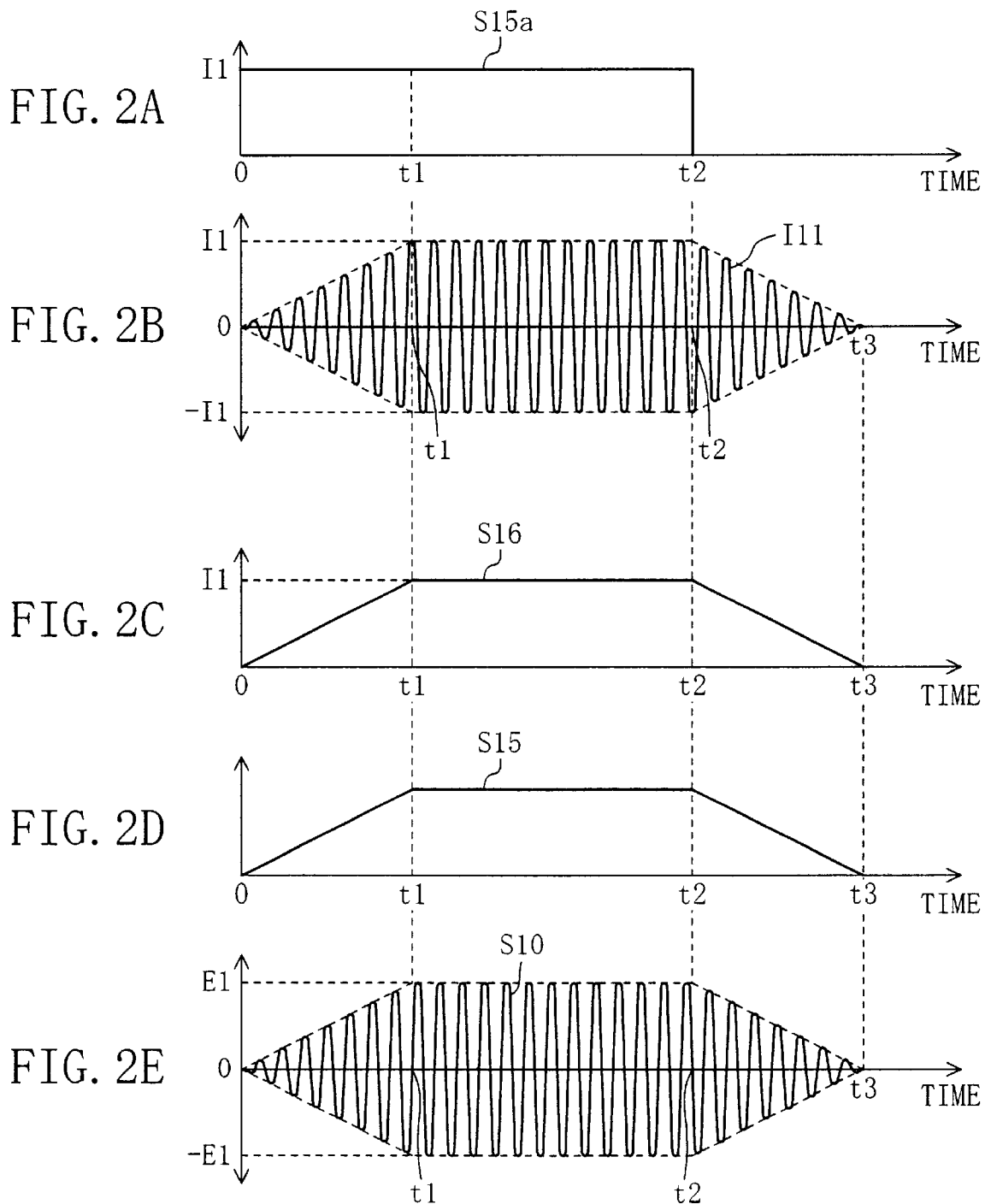

SEMICONDUCTOR WAFER TEST SYSTEM

BACKGROUND OF THE INVENTION

The present invention relates to a system and method for carrying out a non-contact burn-in test on a semiconductor wafer.

Recently, the annual production of semiconductor devices has been rocketing year after year. Generally speaking, the greater the number of devices produced per unit time, the greater the number of devices with infant mortality to be screened out therefrom by an accelerated life test called "burn-in", for example. As is well known in the art, a burn-in test is carried out on semiconductor devices by subjecting the devices to an elevated temperature under an electrical power stress. Some of the devices that failed to withstand the stress are screened out as NO-GOs, while the other devices that could endure the stress successfully are shipped as GOs, or good products. Over the past few years, however, the time afforded to develop new semiconductor devices has been more and more limited. So the burn-in test should also be finished in a shorter amount of time. In addition, a wafer test system for use in such a burn-in test also has to have its size further reduced, since the devices under test have been downsized almost day after day.

The burn-in test has normally been carried out by applying a stress voltage onto semiconductor devices on a wafer with probe pins brought into contact with the devices under test.

FIG. 14 illustrates how the burn-in test is carried out on a semiconductor wafer 301 including a great number of semiconductor devices thereon using a known wafer test system. As shown in FIG. 14, the wafer 301, supported on a substrate plate 302, is brought into contact with probe pins extending from a probe card 303, and then supplied with a signal delivered from a tester 304 through the pins of the card 303.

Next, it will be described how the wafer test system operates. In the example illustrated in FIG. 14, the plate 302 is grounded at a potential level of 0 V. The wafer 301 is in electrical contact with the plate 302, and each of the numerous devices on the wafer 301 also has its substrate potential fixed at 0 V. In such a state, the tester 304 outputs a signal to devices under test on the wafer 301 by way of the pins of the card 303. The devices under test, which are in contact with the pins of the card 303, start to operate in response to the signal supplied from the tester 304. As a result, a voltage is applied onto the gate electrode of each of those devices (i.e., transistors). That is to say, a voltage stress is generated between the gate electrode of the transistor and the substrate thereof. In this manner, the devices on the wafer 301 are subjected to the burn-in.

However, if test terminals provided for semiconductor devices on a wafer are of a different type from those provided for devices on another wafer, then the known wafer test system should prepare two mutually different types of probe cards for these two wafers.

SUMMARY OF THE INVENTION

To avoid such an undesirable situation, the present inventor performed a non-contact burn-in test on semiconductor devices on a semiconductor wafer without using any probe pins. In this burn-in test, each of the devices under test on the wafer was exposed to a direct-current (DC) electric field so that a voltage was applied onto the gate oxide film of the devices. Hereinafter, with reference to FIG. 10, I will briefly describe the burn-in test I conducted before describing the summary of my invention. FIG. 10 illustrates a semiconductor wafer test system that I used for the burn-in test. First, the respective elements of the system will be described.

As shown in FIG. 10, a semiconductor wafer 501, including a great number of semiconductor devices under the burn-in test, is supported on a substrate plate 502. The burn-in test is carried out by applying a predetermined voltage from a DC power supply 504 to a conductive plate 500 and by exposing the devices under test on the wafer 501 to an electric field S500 that has been created from the conductive plate 500. The electric field S500 created from the conductive plate 500 has an intensity proportional to the voltage applied from the power supply 504. As a result, a current I501 flows from the plate 502 into the ground.

FIG. 11 illustrates one of the devices under the burn-in test on the wafer 501 to a larger scale. First, the respective elements of the device will be described. As shown in FIG. 11, the semiconductor device (i.e., an MOS transistor in this case) to be exposed to the electric field S500 created from the conductive plate 500 has been electrically isolated from adjacent devices by isolation regions 501e and 501f. The device includes gate electrode 501a, gate oxide film 501b, source/drain regions 501c and 501d and p-well 501g. That is to say, part of the wafer 501 for this device includes the source/drain regions 501c and 501d, p-well 501g and substrate portion 501h.

As also shown in FIG. 11, the wafer 501 is supported on the substrate plate 502. The device is exposed to the electric field S500 that has been created from the conductive plate 500 by applying a voltage from the DC power supply 504 to the conductive plate 500. A parallel plate capacitor is formed between the conductive plate 500 and gate electrode 501a and another parallel plate capacitor is formed between the gate electrode 501a and p-well 501g. A leakage resistor 512 exists between the gate electrode 501a and the ground and a current I501 flows from the substrate plate 502 into the ground. In FIG. 11, only one n-channel MOS transistor is illustrated as one of the great many devices on the wafer 501 for the sake of simplicity. Accordingly, the source/drain regions 501c and 501d have been doped with an n-type dopant, while the p-well 501g and substrate portion 501h are of p-type.

The substrate portion 501h is in electrical contact with the grounded substrate plate 502 and is fixed at 0 V. The p-well 501g is in contact with the substrate portion 501h and these regions 501g and 501h are both of p-type. So the p-well 501g is also fixed at 0 V.

When a voltage V0 (V) is applied to the conductive plate 500, the electric field S500 is created, thereby polarizing the gate electrode 501a and producing a voltage Va0 (V) at the gate electrode 501a. As a result, an electric field stress Ea (V/m) corresponding to the voltage Va0 (V) is placed on the gate oxide film 501b. Hereinafter, this stress will be analyzed quantitatively.

Suppose the area of the gate electrode 501a is Sa ($m^2$), the distance between the conductive plate 500 and gate electrode 501a is d1 (m), the thickness of the gate oxide film 501b is d2 (m), the permeability between the conductive plate 500 and gate electrode 501a is $\epsilon$1 (C/(V·m)) and the permeability of the gate oxide film 501b is $\epsilon$2 (C/(V·m)). To simplify the computation, one parallel plate capacitor 510 is supposed to be formed between the conductive plate 500 and gate electrode 501a and another parallel plate capacitor 511 is supposed to be formed between the gate electrode 501a and p-well 501g as schematically illustrated in FIG. 12.

As also shown in FIG. 12, a voltage is applied from the DC power supply 504 to the conductive plate 500, thereby creating the electric field to which the device under test is exposed. A leakage resistor 512 exists between the gate electrode 501a and the ground.

Suppose no current flows through the resistor 512 for a while after the voltage V0 (V) has been applied to the conductive plate 500. Then, a quantity Q0 (C) of charge stored on the parallel plate capacitor 510 is given by the following Equation (1):

$$Q0 = \epsilon1 \cdot S/d1 \times (V0 - Va0) \tag{1}$$

where Va0 (V) is the voltage induced at the gate electrode 501a.

The charge quantity Q0 can also be obtained by the following Equation (2) using the quantity of charge stored on the parallel plate capacitor 511:

$$Q0 = \epsilon2 \cdot S/d2 \times Va0 \tag{2}$$

Combining these Equations (1) and (2) together, the voltage Va0 (V) induced at the gate electrode 501a is given by the following Equation (3):

$$Va0 = \epsilon1 \cdot d2/(\epsilon2 \cdot d1 + \epsilon1 \cdot d2) \times V0 \tag{3}$$

Accordingly, the electric field stress Ea0 (V/m) given by the following Equation (4):

$$Ea0 = Va0/d2 = \epsilon1/(\epsilon2 \cdot d1 + \epsilon1 \cdot d2) \times V0 \tag{4}$$

is placed on the gate oxide film 501b. Also, the intensity E0 (V/m) of the electric field S500 is given by the following Equation (5):

$$E0 = \epsilon2/\epsilon1 \times Ea0 \tag{5}$$

It should be noted that the gate electrode 501a is grounded weakly due to the existence of metal interconnects and leakage current components. Accordingly, the induced charges gradually disappear with time. So if a DC voltage is applied to the conductive plate 500, then the electric field stress with the intensity Ea0 can be placed on the gate oxide film 501b for just a short period of time. To avoid this unwanted situation, if the electric field to be placed on the gate oxide film 501b to carry out the burn-in test is represented by E1 (V/m), then an electric field intenser than E1 (V/m) should be placed on the gate oxide film 501b initially.

Hereinafter, it will be described how this semiconductor wafer test system operates. First, the voltage V0 (V) to be applied to the conductive plate 500 will be considered.

In general, dielectric breakdown should occur even in a gate oxide film 501b with no defects if the gate oxide film 501b were exposed to an excessively high electric field. Accordingly, the voltage Va0 induced at the gate electrode 501a should be set to:

$$Va0 = d2 \cdot E10 \tag{6}$$

where E10 (V/m) is a critical electric field with an intensity at and under which no dielectric breakdown occurs.

Combining the Equations (3) and (6) together, the critical electric field E10 (V/m) will be placed on the gate oxide film 501b initially if the voltage V0 given by $$V0 = (\epsilon2 \cdot d1 + \epsilon1 \cdot d2)/\epsilon1 \cdot d2 \times d2 \cdot E10 \tag{7}$$

is applied to the conductive plate 500.

Next, it will be described how much the electric field decreases its intensity due to the existence of the leakage resistor 512.

The capacitance c511 (F) of the parallel plate capacitor 511 is given by $$c511 = \epsilon2 \cdot S/d2 \tag{8}$$

Supposing the resistance of the leakage resistor 512 is r512 (Ω), the electric field Ea(t) (V/m), which will be placed on the gate oxide film 501b when a period of time t (s) has passed, is given by $$Ea(t) = E10 \exp(-t/(c511 \cdot r512)) \tag{9}$$

FIG. 13 illustrates this decrease in electric field intensity with time. The period of time t5 (s), during which an electric field equal to or intenser than E1 (V/m) is placed on the gate oxide film 501b, is given by $$t5 = c511 \cdot r512 \times \ln(E10/E1) \tag{10}$$

Accordingly, during this period of time t5 (s), an electric field stress with an intensity equal to or greater than the predetermined field intensity E1 (V/m) is continuously placed on the gate oxide film 501b. That is to say, the gate oxide film 501b is subjected to a burn-in test for this period of time t5.

In this method, however, the time t5 (s) is determined by only four process constants of c511, r512, E10 and E1. Accordingly, unless the process conditions are changed, the burn-in period cannot be extended.

In addition, no reverse electric field is applicable to the gate oxide film, so devices with early failures can be screened out far less completely. Furthermore, the current flows through the substrate always unidirectionally except the initial state. Accordingly, not so much stress can be placed on lattice defects that exist either in the substrate or around the interface between the gate electrode and the substrate. Thus, those failures can be screened out only insufficiently.

It is therefore an object of this invention to get the burn-in period changed by various parameters other than those process constants for a semiconductor wafer test system for use in a burn-in test on semiconductor devices.

Another object of this invention is to make a reverse electric field applicable to the devices under test.

Still another object of this invention is to place a sufficiently high voltage stress on lattice defects existing in the substrate or around the substrate/gate electrode interface.

To achieve these objects, according to the present invention, a semiconductor wafer under a burn-in test is exposed to either electromagnetic wave or alternating-current electric field.

Specifically, an inventive semiconductor wafer test system is a system for carrying out a burn-in test on a great number of semiconductor devices that have been formed on a semiconductor wafer. Each said device includes a gate oxide film between a substrate and a gate electrode. The gate electrode is connected to a metal interconnect. The system includes electromagnetic wave generating means. The generating means exposes the wafer to an electromagnetic wave as an alternating current wave and places an electric field with a predetermined intensity on the gate oxide film of each said device on the wafer, thereby carrying out the burn-in test on the devices.

Another inventive semiconductor wafer test system is a system for carrying out a burn-in test on a great number of semiconductor devices on a semiconductor wafer by exposing the wafer to an alternating-current electric field, not the electromagnetic wave.

In one embodiment of the present invention, the inventive system may include stress sensing means and control means.

The stress sensing means senses a voltage stress imposed on the gate oxide film of each said device while the wafer is being exposed to the electromagnetic wave or the alternating-current electric field. The control means controls the intensity of the electromagnetic wave or the alternating-current electric field so that the voltage stress sensed by the stress sensing means falls within a preset threshold value range.

In this particular embodiment, the voltage stress, which has been sensed by the stress sensing means as being imposed on the gate oxide film, preferably includes forward and reverse voltage stresses. The control means preferably controls the intensity of the electromagnetic wave or the alternating-current electric field so that the forward and reverse voltage stresses imposed on the gate oxide film fall within first and second preset threshold value ranges, respectively. In this case, the second range is preferably lower than the first range.

Still another inventive semiconductor wafer test system is a system for carrying out a burn-in test on a great number of semiconductor devices formed on a semiconductor wafer. Each said device includes a gate oxide film between a substrate and a gate electrode. The gate electrode is connected to a metal interconnect. The system includes electric field generating means and driving means. The generating means includes a conductive plate for exposing the wafer to an electric field as a direct current wave. The generating means sets the electric field placed on the gate oxide film of each said device on the wafer to a predetermined intensity. The driving means loads and unloads the wafer into/from a space where the electric field, generated from the conductive plate, exists. In this manner, the wafer is exposed to an alternating-current electric field to carry out the burn-in test on the devices.

According to the present invention, a semiconductor wafer can be exposed to electromagnetic wave or alternating-current electric field for an interval of a variable length. Thus, a burn-in test can be carried out on semiconductor devices on the wafer for any arbitrary period of time. In addition, a reverse electric field is also applicable to the gate oxide film of each of those devices. Accordingly, devices with failures can be screened out with much more certainty. Also, a sufficient stress can be placed on lattice defects existing in the substrate or around the substrate/gate electrode interface.

Moreover, according to the present invention, a reverse voltage applied to the gate oxide film of any semiconductor device is set no greater than the maximum allowable reverse voltage of the gate oxide film. Thus, the semiconductor devices can be tested without deteriorating the gate oxide film of any normal one of the devices.

Furthermore, according to the present invention, the driving means alternately loads and unloads the wafer into/from a space where the electric field generated from the conductive plate exists. Accordingly, it is possible to expose the semiconductor devices on the wafer to an alternating-current electric field and freely set the burn-in period to any arbitrary length while using a direct current power supply.

BRIEF DESCRIPTION OF THE DRAWINGS

FIG. 1 illustrates an exemplary overall arrangement for a semiconductor wafer test system according to a first embodiment of the present invention.

FIGS. 2A, 2B, 2C, 2D and 2E are timing diagrams illustrating the waveforms of reference current signal, current flowing, output signal of a tester, output signal of a power supply controller and electromagnetic wave, respectively, in the test system of the first embodiment.

DESCRIPTION OF THE PREFERRED EMBODIMENTS

Figure 3A:
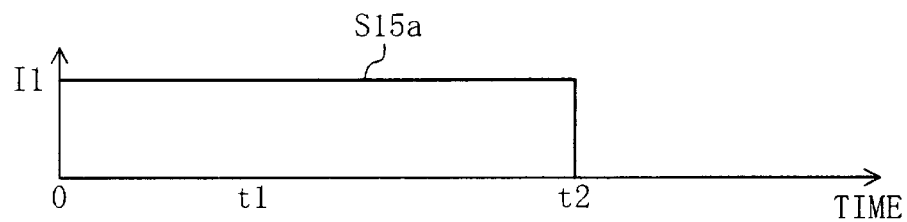
FIGS. 3A, 3B, 3C, 3D and 3E are timing diagrams illustrating the waveforms of reference current signal, current flowing, output signal of a tester, output signal of a power supply controller and electromagnetic wave, respectively, in a semiconductor wafer test system according to a second embodiment of the present invention.
Figure 3B:
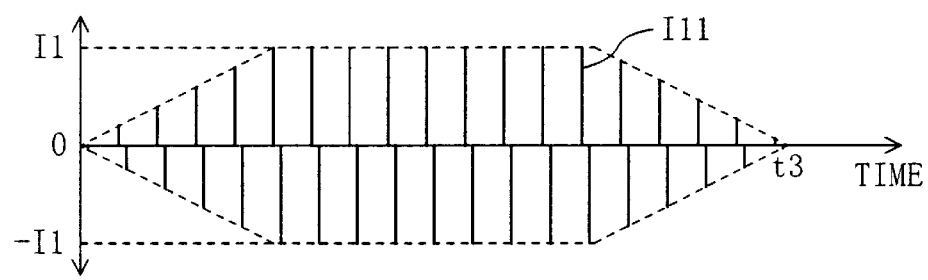
Figure 3C:
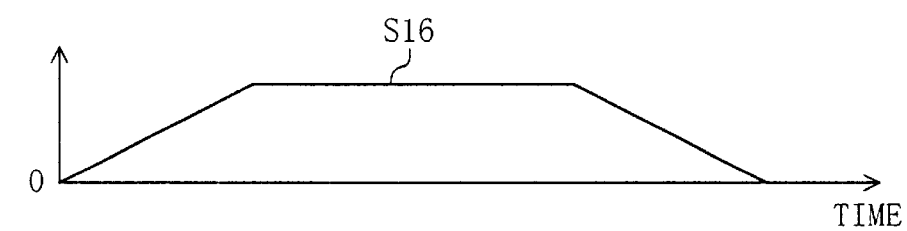
Figure 3D:
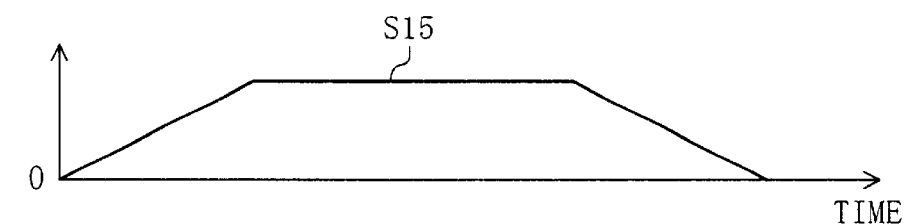

Hereinafter, preferred embodiments of the present invention will be described with reference to the accompanying drawings.

Embodiment 1

FIG. 1 illustrates an exemplary overall arrangement for a semiconductor wafer test system according to a first embodiment of the present invention. First, the respective elements of the system will be described.

As shown in FIG. 1, the test system is for use to carry out a burn-in test on a great number of semiconductor devices that have been formed on a semiconductor wafer 11 supported on a substrate plate 12. The test system includes: electromagnetic wave generator 10 for generating an electromagnetic wave S10 to which the wafer 11 should be exposed; and control unit 13 for controlling the generator 10.

Although not shown in FIG. 1, each of those semiconductor devices on the wafer 11 may be a transistor including substrate, gate electrode and gate oxide film located between the substrate and gate electrode. A metal interconnect is connected to the gate electrode of each transistor. That is to say, the devices on the wafer 11 have already gone through their fabrication process and will be final products when the wafer 11 is diced into respective chips. To carry out a burn-in test on the devices on the wafer 11 efficiently, the metal interconnect, connected to the gate electrode of each of those transistors, preferably does not cover the gate oxide film thereof. As for the devices on the wafer 11, the same statements will be applicable to the other embodiments of the present invention.

As shown in FIG. 1, the control unit 13 includes power supply 14, power supply controller 15 and tester 16. The power supply 14 supplies power to the electromagnetic wave generator 10 to get the electromagnetic wave S10 generated by the generator 10. The power supply controller 15 controls the power supply 14 by outputting a control signal S15 thereto and is controlled itself in response to a reference current signal S15a supplied thereto. The tester 16 measures a current I11 flowing between the substrate plate 12 and the ground and outputs a signal S16 to the power supply controller 15.

In response to the output signal S15 of the power supply controller 15, the power supply 14 supplies a current in the amount proportional to the level of the signal S15 to the electromagnetic wave generator 10. The electromagnetic wave generator 10 generates an electromagnetic wave with an intensity proportional to the amount of current supplied from the power supply 14. If the current value represented by the output signal S16 of the tester 16 is smaller than the preset value represented by the reference current signal S15a, then the power supply controller 15 increases the level of its output signal S15. On the other hand, if the former current value is greater than the latter current value, then the power supply controller 15 decreases the level of its output signal S15. If these current values are equal to each other, the power supply controller 15 retains the level of its output signal S15. And in the initial state, the power supply controller 15 outputs zero as its output signal S15. The tester 16 measures the alternating current I11 flowing between the substrate plate 12 and the ground, and outputs the amplitude of the current as its output signal S16 to the power supply controller 15.

The tester 16 of the control unit 13 is an exemplary stress sensing means 18 as defined in the appended claims. That is to say, the tester 16 senses an electric field stress, which is imposed on the gate oxide film of each device on the wafer 11 as a result of the exposure to the electromagnetic wave generated from the electromagnetic wave generator 10, by the current I11 flowing between the substrate plate 12 and the ground. Also, the power supply controller 15 is an exemplary control means 19. Specifically, the power supply controller 15 controls the electric field intensity of the electromagnetic wave, generated by the electromagnetic wave generator 10, so that the current I11, sensed by the stress sensing means 18, falls within a preset threshold value range defined by the reference current signal S15a.

Next, it will be described how the semiconductor wafer test system with such a configuration operates. FIGS. 2A, 2B, 2C, 2D and 2E illustrate the waveforms of the reference current signal S15a supplied to the power supply controller 15, current I11 flowing between the substrate plate 12 and the ground, output signal S16 of the tester 16, output signal S15 of the power supply controller 15 and electromagnetic wave S10 generated from the electromagnetic wave generator 10, respectively.

In carrying out a burn-in test on the devices on the wafer 11, the substrate plate 12 is grounded at a potential level of 0 V. The wafer 11 is in electrical contact with the substrate plate 12, and each of the numerous devices on the wafer 11 also has its substrate potential fixed at 0 V. In its initial state, the gate electrode of each of those devices is also fixed at 0 V due to the existence of a metal interconnect, connected to the gate electrode, and leakage current components. While the burn-in test is carried out, an alternating current flows between the substrate plate 12 and the ground. This alternating current has a value proportional to the total area of gate electrodes that are exposed to the electromagnetic wave among the gate electrodes of the semiconductor devices. Hereinafter, this relationship will be analyzed quantitatively.

Suppose the electromagnetic wave generated from the electromagnetic wave generator 10 has a frequency of f (Hz) and an electric field intensity of E0 (V/m), the area exposed to the electromagnetic wave is S (m$^2$), the gate oxide film of semiconductor devices has an average thickness of d (m) and an average gate density is D. Then, the electric field intensity E (V/m) of the electromagnetic wave generated from the electromagnetic wave generator 10 at a time t (s) is given by the following complex notation:

$$E = E0 \, \exp(j2\pi ft) \tag{11}$$

where j is an imaginary unit. When the devices on the wafer 11 are exposed to the electromagnetic wave emitted from the electromagnetic wave generator 10, the total area of gate electrodes included in the exposure range is obtained by D×S (m$^2$). Accordingly, the current I11, flowing from the substrate plate 12 into the ground when the electric field E is placed on the gate electrodes, is given by $$I11 = \epsilon \cdot D \cdot S/d \times d \cdot E0 \; j2\pi f \exp(j2\pi ft) = 2\pi f \cdot \epsilon \cdot D \cdot S \cdot E0 \; \exp(j(2\pi ft + \pi/2)) \tag{12}$$

where $\epsilon$ is the permeability. Equation (12) shows that the current I11 flowing is proportional to not only the total gate area of the devices existing in the part of the wafer 11 that is exposed to the electromagnetic wave but also the electric field intensity E0 (V/m) of the electromagnetic wave. In the burn-in test, the gate oxide film is exposed to an electric field with a predetermined intensity. Accordingly, supposing the reference electric field intensity is E1 (V/m), when the amplitude of the alternating current I11 given by Equation (12) reaches that of the current I1 (A) given by $$I1 = 2\pi f \cdot \epsilon \cdot D \cdot S \cdot E1 (A) \tag{13}$$

the burn-in test is completed.

First, the reference current signal S15a to be supplied to the power supply controller 15 is set to the current I1 (A). In the initial state, this current I11 is 0 (A), so the output signal S16 of the tester 16 is also 0 (A). Then, the power supply controller 15 compares the reference current signal S15a to the output signal S16 of the tester 16, thereby increasing its output voltage S15 from the initial value of 0 V. This state corresponds to the time 0 (s) shown in FIG. 2D. As the output voltage S15 of the power supply controller 15 rises, the current supplied from the power supply 14 to the electromagnetic wave generator 10 increases, so does the electric field intensity of the electromagnetic wave generated from the electromagnetic wave generator 10. As a result, the alternating current I11 flowing continuously increases its amplitude in the interval between 0 (s) and the time t1 (s) at which the output signal S16 of the tester 16 reaches the current I1 (A) as shown in FIGS. 2B and 2C.

At the time t1 (s), the output signal S16 of the tester 16 gets equal to the current I1 (A). Accordingly, the power supply controller 15 has its output signal S15 fixed at the current value. As a result, from the time t1 (s) on, a constant amount of current will be supplied from the power supply 14 and the devices on the wafer 11 will be exposed to an electromagnetic wave with a constant electric field intensity.

Next, at a time t2 (s), the reference current signal S15a supplied to the power supply controller 15 is set to 0 (A). Comparing the output signal S16 of the tester 16 to the reference current signal S15a, the power supply controller 15 gradually decreases its output voltage S15. As the output voltage S15 of the power supply controller 15 falls, the current supplied from the power supply 14 to the electromagnetic wave generator 10 decreases, so does the electric field intensity of the electromagnetic wave generated from the electromagnetic wave generator 10. As a result, the alternating current I11 flowing continuously decreases its amplitude in the interval between the time t2 (s) and a time t3 (s) at which the output signal S16 of the tester 16 reaches 0 (A) as shown in FIGS. 2B and 2C. At the time t3 (s), the output signal S16 of the tester 16 reaches 0 (A), which is equal to the value of the reference current signal S15a. Accordingly, the tester 16 has its output signal S16 fixed at 0 (A).

That is to say, in the example illustrated in FIGS. 2A through 2E, a predetermined stress is placed on the devices (i.e., the burn-in test is carried out) only in the interval between the times t1 (s) and t2 (s).

In this manner, a non-contact burn-in test can be carried out according to this embodiment on the devices on the wafer 11. Accordingly, there is no need to use or align a great number of probes or to adjust the contact pressure thereof, thus downsizing the semiconductor wafer test system and shortening the test period. In addition, just by changing the length of the interval between the times t1 and t2, the burn-in period can be set freely. Furthermore, since a reverse electric field is also placed on the devices, failures can be screened out much more effectively. Also, the current flows bidirectionally through the substrate of each of those devices. Thus, sufficient stress can be placed on lattice defects existing either in the substrate or around the substrate/gate electrode interface. Consequently, devices with failures can be screened out even more effectively.

It should be noted that not just a forward electric field E1 (V/m) but also a reverse electric field −E1 (V/m) are placed on the gate oxide film of each of those devices. When exposed to a reverse electric field, the gate oxide film might degrade its characteristics due to movement of carriers. For that reason, care should be taken so as not to place a reverse electric field with an intensity exceeding a maximum allowable value.

Embodiment 2

Next, a second embodiment of the present invention will be described. A semiconductor wafer test system according to the second embodiment may have the same overall configuration as the counterpart of the first embodiment, and the illustration thereof is omitted. In this second embodiment, the electromagnetic wave generated from the electromagnetic wave generator 10 is applied as electromagnetic pulses to limit the intensity of the reverse electric field placed on the gate oxide film of each semiconductor device to an allowable range.

FIGS. 3A through 3E illustrate a situation where the electromagnetic wave generated from the electromagnetic wave generator 10 is applied as electromagnetic pulses. In this embodiment, the intensity of the forward electric field placed on the gate oxide film of each device is set to the reference value E1 (V/m) and the maximum allowable intensity of the reverse electric field placed on the gate oxide film is set to E2 (V/m). In this manner, the duty cycle Duty of the electromagnetic pulses is set to $$\text{Duty} = E2/(E1+E2) \tag{14}$$

Figure 3E:
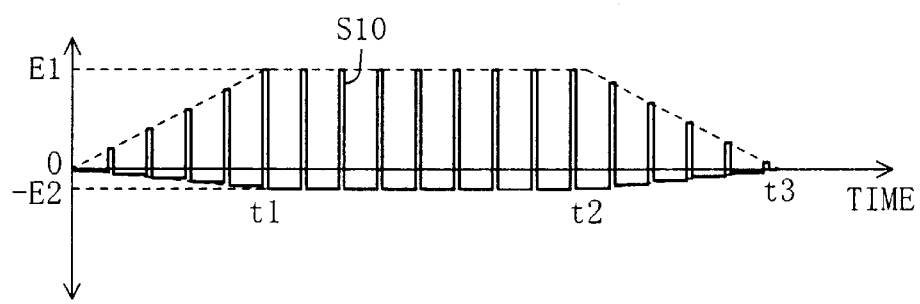

In the other respects, the system of the second embodiment operates in the same way as the counterpart of the first embodiment. It should be noted that the positive intensity of the electromagnetic pulses, associated with the forward electric field, is E1 (V/m), while the negative intensity of the electromagnetic pulses, associated with the reverse electric field, is −E2 (v/m) as shown in FIG. 3E. Thus, according to this embodiment, no reverse electric field with an intensity exceeding its maximum allowable value is placed on the gate oxide film of each semiconductor device.

Embodiment 3

Figure 4:
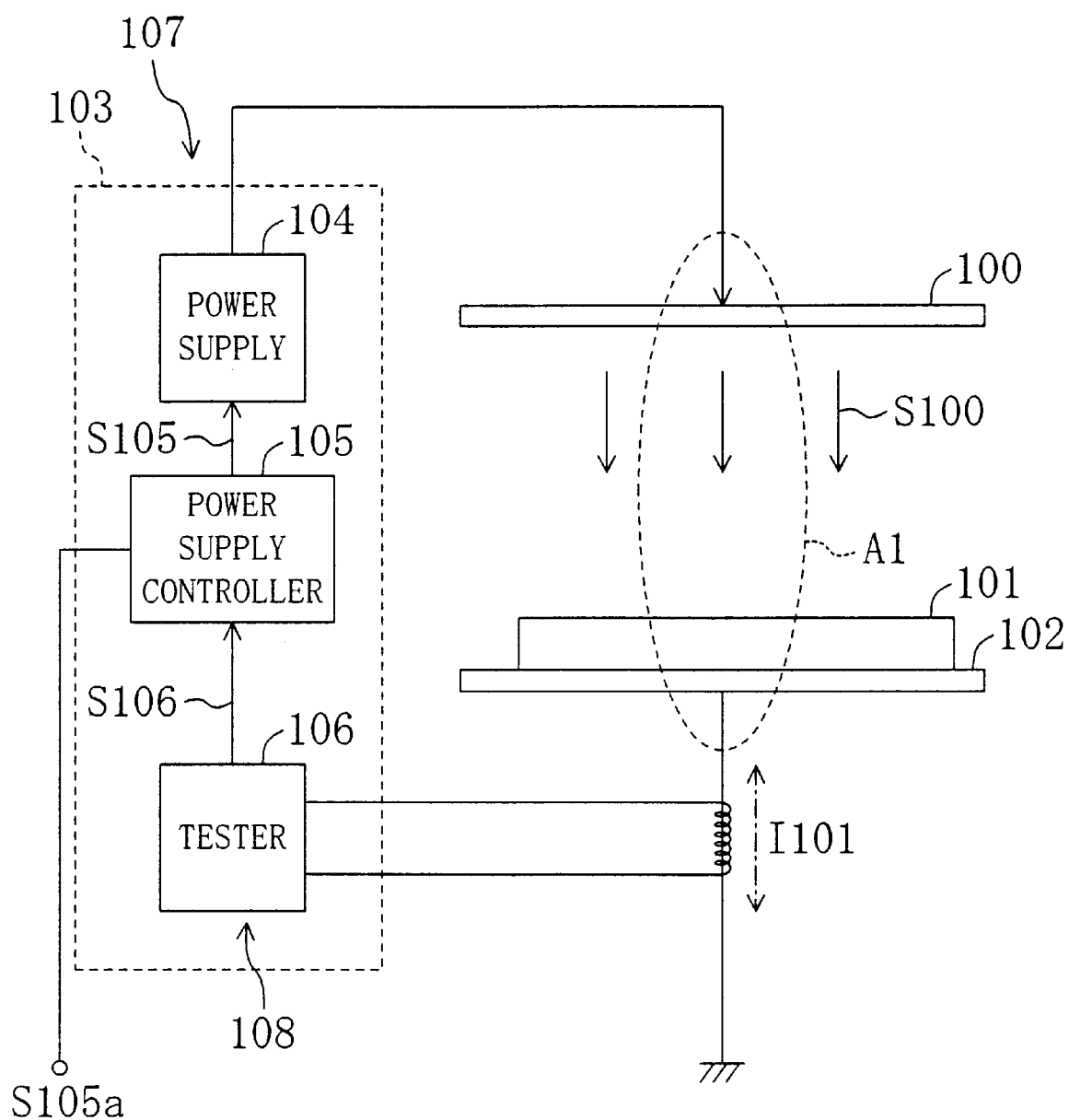
FIG. 4 illustrates an exemplary overall arrangement for a semiconductor wafer test system according to a third embodiment of the present invention.

FIG. 4 illustrates an exemplary overall arrangement for a semiconductor wafer test system according to a third embodiment of the present invention. First, the respective elements of the system will be described.

As shown in FIG. 4, this test system is for use to carry out a burn-in test on a great number of semiconductor devices that have been formed on a semiconductor wafer 101 supported on a substrate plate 102. The test system includes: conductive plate 100 for generating an electric field S100 to which the wafer 101 should be exposed; and control unit 103 for controlling an alternating-current (ac) voltage to be applied to the conductive plate 100. The control unit 103 includes power supply 104, power supply controller 105 and tester 106. The power supply 104 applies an ac voltage to the conductive plate 100. The power supply controller 105 controls the power supply 104 by outputting a control signal S105 thereto and is controlled itself in response to a reference current signal S105a supplied thereto. The tester 106 measures a current I101 flowing between the substrate plate 102 and the ground and outputs a signal S106 to the power supply controller 105.

In response to the output signal S105 of the power supply controller 105, the power supply 104 supplies an ac voltage, whose amplitude is proportional to the level of the output signal S105, to the conductive plate 100. The conductive plate 100 generates an electric field S100 with an intensity proportional to the voltage applied from the power supply 104. If the current value represented by the output signal S106 of the tester 106 is smaller than the preset one represented by the reference current signal S105a, then the power supply controller 105 increases the level of its output signal S105. On the other hand, if the former current value is greater than the latter current value, then the power supply controller 105 decreases the level of its output signal S105. If these current values are equal to each other, the power supply controller 105 retains the level of its output signal S105. And in the initial state, the power supply controller 105 outputs zero as its output signal S105. The tester 106 measures the alternating current I101 and outputs the amplitude of the current as its output signal S106 to the power supply controller 105.

The power supply 104 and power supply controller 105 of the control unit 103 and the conductive plate 100 together functions as electric field generating means 107 for exposing the devices on the wafer 101 to an electric field with an intensity proportional to the ac voltage to carry out a burn-in test on the devices. Also, the tester 106 of the control unit 103 is an exemplary stress sensing means 108 as defined in the appended claims. That is to say, the tester 106 senses the electric field stress, which is placed on the devices on the wafer 101 as a result of the exposure to the electric field generated from the electric field generating means 107, by the current I101 flowing between the substrate plate 102 and the ground.

Figure 5:
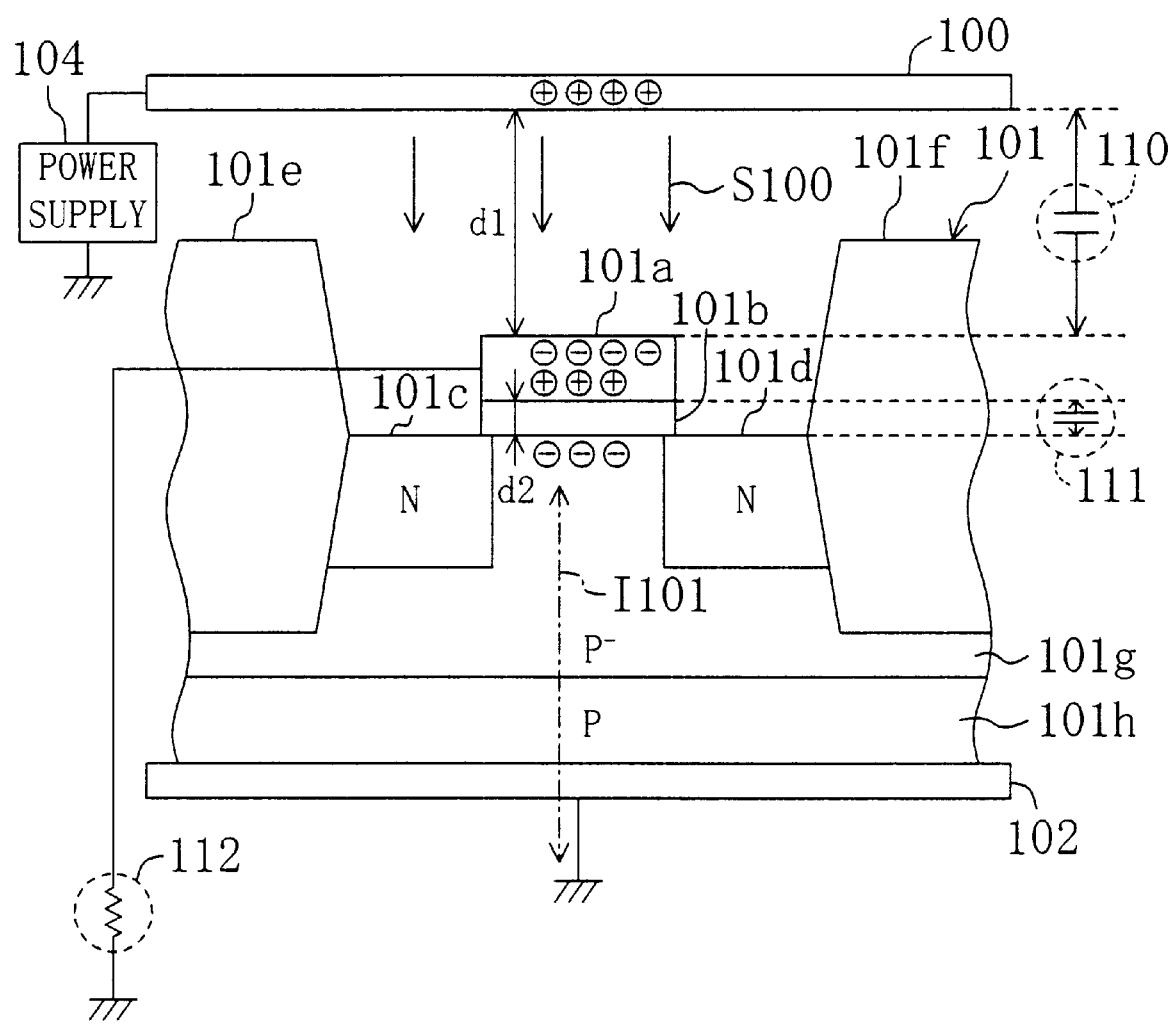
FIG. 5 is a cross-sectional view illustrating the main portion of a semiconductor device under test.

FIG. 5 illustrates part of the circle A1 shown in FIG. 4, including part of the conductive plate 100, some of the devices under the burn-in test on the wafer 11 and part of the substrate plate 102, to a larger scale. As shown in FIG. 5, the semiconductor device (i.e., an MOS transistor in this case) has been electrically isolated from adjacent devices by isolation regions 101e and 101f. The device includes gate electrode 111a, gate oxide film 101b, source/drain regions 101c and 110d and p-well 101g. That is to say, part of the wafer 101 for this device includes the source/drain regions 101c and 101d, p-well 101g and substrate portion 101h. As also shown in FIG. 5, the wafer 101 is supported on the substrate plate 102. The device is exposed to the electric field S100 that has been created from the conductive plate 100 by applying an ac voltage from the power supply 104 to the conductive plate 100. A parallel plate capacitor 110 is formed between the conductive plate 100 and gate electrode 101a and another parallel plate capacitor 111 is formed between the gate electrode 101a and p-well 101g. A leakage resistor 112 exists between the gate electrode 101a and the ground, and a current I101 flows from the substrate plate 102 into the ground. In FIG. 5, only one n-channel MOS transistor is illustrated as one of the great many devices on the wafer 101 for the sake of simplicity. Accordingly, the source/drain regions 101c and 101d have been doped with an n-type dopant, while the p-well 101g and substrate portion 101h are of p-type.

The substrate portion 101h is in electrical contact with the grounded substrate plate 102 and is fixed at 0 V. The p-well 101g is in contact with the substrate portion 101h and these regions 101g and 101h are both of p-type. So the p-well 101g is also fixed at 0 V. When a voltage V (V) is applied to the conductive plate 100, the electric field S100 is created, thereby polarizing the gate electrode 101a and inducing a voltage Va (V) at the gate electrode 501a. As a result, an electric field stress Ea (V/m) proportional to the voltage Va (V) is placed on the gate oxide film 101b. Hereinafter, this stress will be analyzed quantitatively.

Suppose the area of the gate electrode 101a is Sa (m²), the distance between the conductive plate 100 and gate electrode 101a is d1 (m), the thickness of the gate oxide film 101b is d2 (m), the permeability between the conductive plate 100 and gate electrode 101a is ϵ1 (c/(V·m)) and the permeability of the gate oxide film 101b is ϵ2 (C/(V·m)). To simplify the computation, one parallel plate capacitor 110 is formed between the conductive plate 100 and gate electrode 101a and another parallel plate capacitor 111 is formed between the gate electrode 101a and p-well 101g as shown in FIG. 6.

Figure 6:
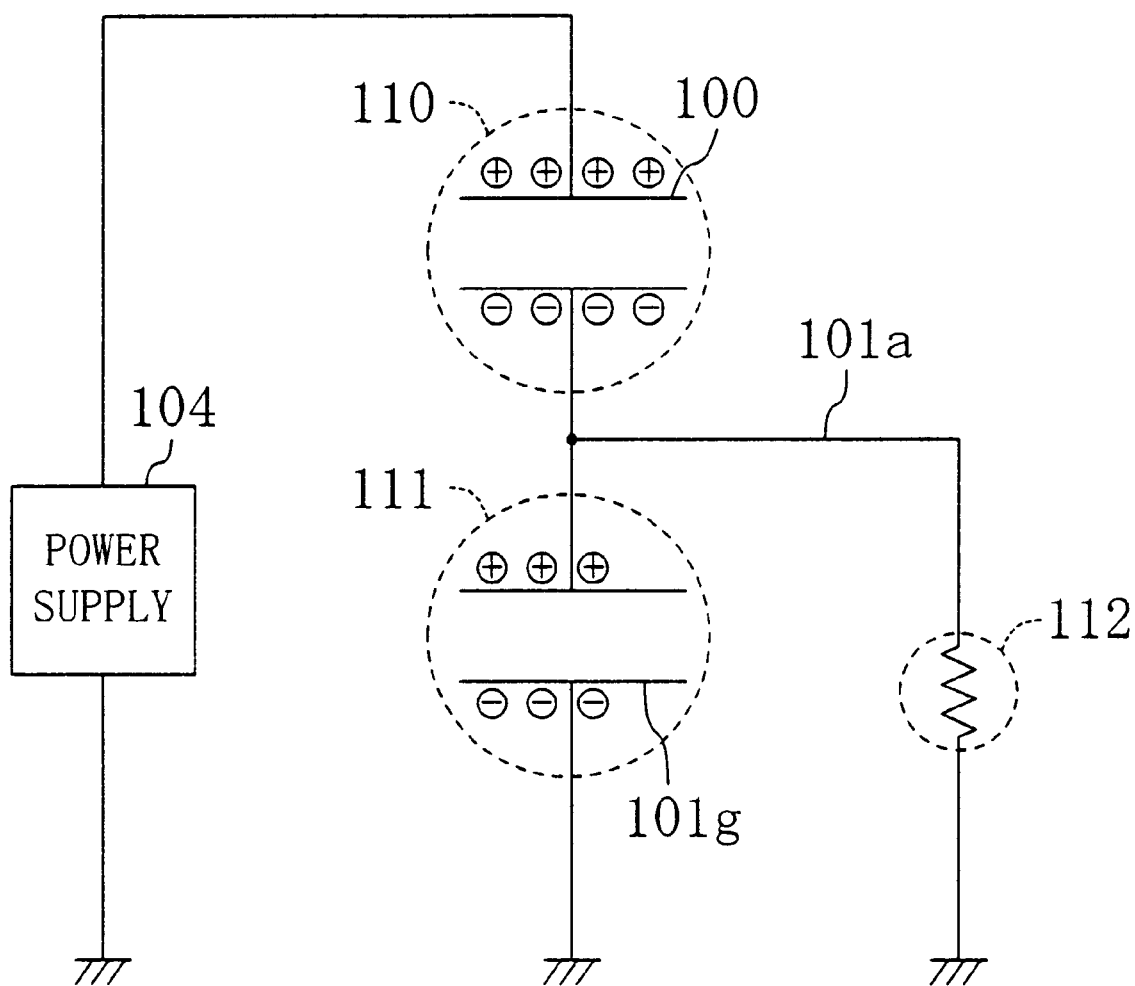
FIG. 6 is a schematic representation illustrating how the test system of the third embodiment places an electric field stress on a semiconductor wafer under test.
Figure 7A:
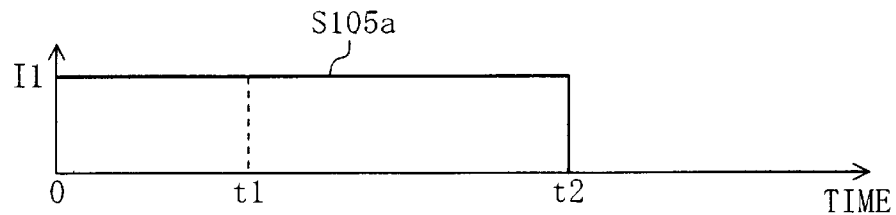
FIGS. 7A, 7B, 7C, 7D and 7E are timing diagrams illustrating the waveforms of reference current signal, current flowing, output signal of a tester, output signal of a power supply controller and electric field generated from a conductive plate, respectively, in the test system of the third embodiment.
Figure 7B:
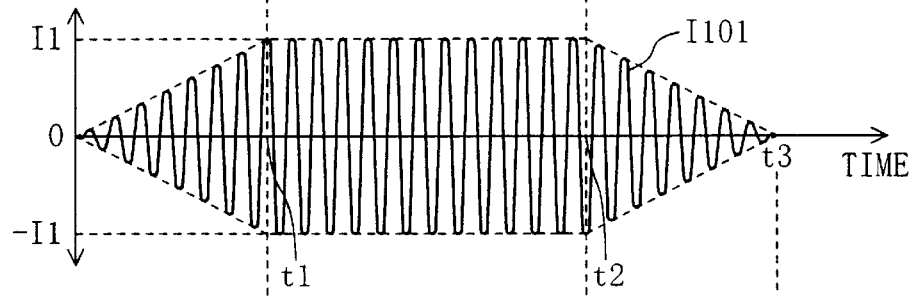
Figure 7C:
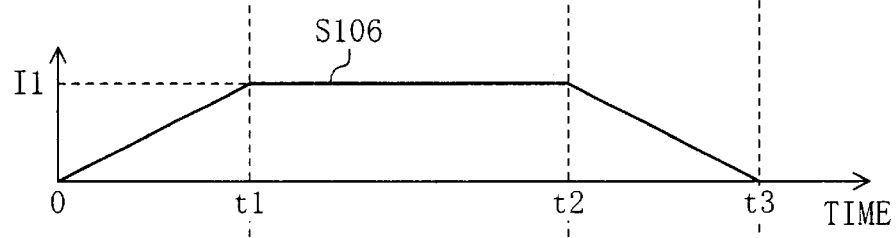
Figure 7D:
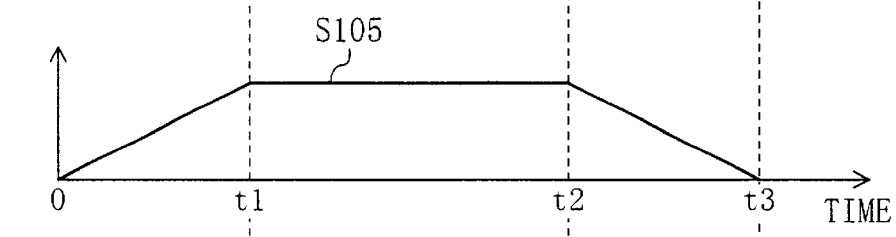
Figure 7E:
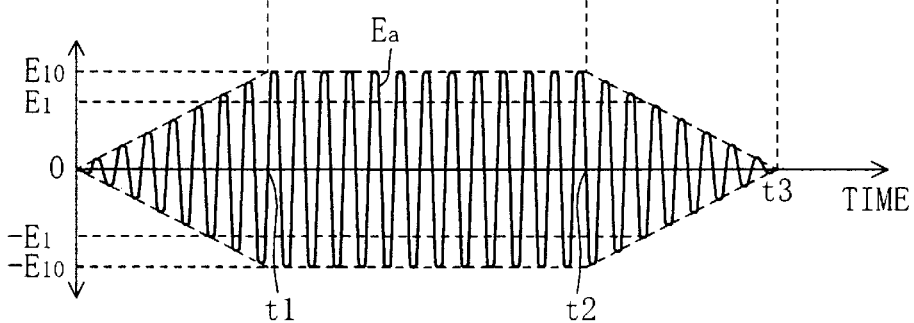

FIG. 6 is a schematic representation of the structure shown in FIG. 5. As also shown in FIG. 6, an ac voltage is applied from the power supply 104 to the conductive plate 100, thereby creating the electric field to which the devices will be exposed. A leakage resistor 112 exists between the gate electrode 101a and the ground.

The capacitance values c110 (F) and c111 (F) of the parallel plate capacitors 110 and 111 are given by $$c110 = \epsilon1 \cdot S/d1 \quad (15)$$

$$c111 = \epsilon2 \cdot S/d2 \quad (16)$$

Supposing the resistance value of the leakage resistor 112 is r112 (Ω) and the voltage applied to the conductive plate 100 is V(t) (V), the voltage Va(t) (V) placed on the gate oxide film 101b is given by the differential equation:

$$Va(t) = r112 \cdot c110 \, (d\,V(t)/dt) - r112 \cdot (c110 + c111) \times (d\,Va(t)/dt) \quad (17)$$

Next, it will be described how the test system with such a configuration operates. FIGS. 7A, 7B, 7C, 7D and 7E illustrate the waveforms of the reference current signal S105a, current I101 flowing, output signal S106 of the tester 106, output signal S105 of the power supply controller 105 and electric field S100, respectively.

The substrate plate 102 is grounded at a potential level of 0 V. The wafer 101 is in electrical contact with the substrate plate 102, and each of the numerous devices on the wafer 101 also has its substrate potential fixed at 0 V. In its initial state, the gate electrode 101a of each of those devices is also fixed at 0 V due to the existence of a metal interconnect and leakage current components. While the burn-in test is carried out, an alternating current flows between the substrate plate 102 and the ground. This alternating current has a value proportional to the total area of gate electrodes 101a that are exposed to the electric field among the gate electrodes 101a of the devices. Hereinafter, this relationship will be analyzed quantitatively.

Suppose the voltage applied to the conductive plate 100 has a frequency of f (Hz) and amplitude of V0 (V), the area exposed to the electric field is S (m²) and the devices have an average gate density of D. Then, the voltage V(t) (V) applied to the conductive plate 100 at a time t (s) is given by the following complex notation:

$$V(t) = V0 \, \exp(j2\pi ft) \quad (18)$$

where j is an imaginary unit. Accordingly, the voltage Va(t) (V) placed on the gate oxide film 101b at the time t (s) is given by $$Va(t) = Va0 \, \exp(j2\pi ft) \quad (19)$$

Combining Equations (15) and (19) together, the voltage Va0 (V) produced at the gate electrode 101a is given by $$Va0 = r112 \cdot c110/(r112 \cdot (c110 + c111) + 1/j2\pi f) \times V0 \quad (20)$$

If the frequency f (Hz) is set equal to or greater than 1/r112(c110+c111), the intensity of the electric field Ea(t) (V/m) placed on the gate oxide film 101b is given by $$Ea(t) = Va(t)/d2 = Ea0 \, \exp(j2\pi ft) \quad (21)$$

in accordance with Equations (19) and (20). On the other hand, the intensity of the electric field Ea0 (V/m) placed on the gate electrode 101a is given by $$Ea0 = 1/d2 \times c110/(c110 + c111) \times V0 \quad (22)$$

When the devices on the wafer 101 are exposed to the electric field created from the conductive plate 100, the total area of gate electrodes included in the exposure range is obtained by D×S (m²). Accordingly, the current I101, flowing between the substrate plate 102 and the ground when the voltage V(t) (V) is applied to the conductive plate 100, is given by $$I101 = 2\pi f \cdot c110 \cdot c111/(c110 + c111) \cdot D \cdot S \cdot V0 \, \exp(j(2\pi ft + \pi/2)) = 2\pi f \cdot c111 \cdot D \cdot S \cdot d2 \cdot Ea0 \, \exp(j(2\pi ft + \pi/2)) \quad (23)$$

Equation (23) shows that the current I101 flowing is proportional to not only the total gate area of the devices existing in the range exposed to the electric field but also the amplitude V0 (V) of the voltage applied to the conductive plate 100.

When an excessively intense electric field is placed on the gate oxide film 101b, breakdown will occur even if the gate oxide film 101b has no defects. Accordingly, supposing a critical electric field, below which no breakdown occurs in the gate oxide film 101b, is E10 (V/m), it can be seen from Equation (23) that when the amplitude of the alternating current I101 reaches the current value I1 (A) given by $$I1=2\pi f \cdot c111 \cdot D \cdot S \cdot d2 \cdot E10 \qquad (24)$$

the critical electric field E10 should be placed on the gate oxide film 101b.

Next, it will be described with reference to FIGS. 7A through 7E how to perform a burn-in test with the critical electric field E10 placed on the gate oxide film 101b. This test is carried out as in the first embodiment illustrated in FIGS. 2A through 2E. So this test will be briefly outlined below. First, the reference current signal S105a is set to the current value I1 (A). In the initial state, the current I101 flowing is 0 (A). Then, the power supply controller 105 increases its output voltage S105 from the initial value of 0 V. As the output voltage S105 of the power supply controller 105 rises, the voltage applied from the power supply 104 to the conductive plate 100 increases, so does the intensity of the electric field S100 created from the conductive plate 100. As a result, the current I101 flowing increases its amplitude. At the time t1 (s), the output signal S106 of the tester 106 gets equal to the current I1 (A). Accordingly, the power supply controller 105 has its output signal S105 fixed at the current value. As a result, in the interval between the times t1 (s) and t2 (s), a constant ac voltage is applied from the power supply 104 and the devices on the wafer 101 are exposed to an electric field with a constant intensity. And the critical electric field E10 (V/m) is placed on the gate oxide film 101b thereof.

Thereafter, at a time t2 (s), the reference current signal S105a is set to 0 (A). Accordingly, the power supply controller 105 gradually decreases its output signal S105. As the output voltage S105 of the power supply controller 105 falls, the voltage applied from the power supply 104 decreases, so does the intensity of the electric field S100 created from the conductive plate 100. As a result, the alternating current I101 flowing decreases its amplitude. When the current I101 goes 0 (A) at a time t3 (s), the tester 106 will have its output signal S106 fixed at 0 (A).

That is to say, in the example illustrated in FIGS. 7A through 7E, supposing the current I101 sensed by the tester 106 is the maximum (or threshold) current value given by Equation (24) (i.e., where the maximum electric field placed on the gate oxide film 101b is equal to the critical electric field E10 (V/m)), an electric field with an intensity changing as a sine function is emitted from the conductive plate 100 toward the devices in the interval between the times t1 (s) and t2 (s). As a result, a predetermined electric field stress is placed on the semiconductor devices. Strictly speaking, the burn-in test has been carried out for a period in which the intensity of the electric field placed on the gate oxide film 101b is greater than the minimum required electric field E1 (V/m) and less than the critical electric field E10 (V/m). That is to say, the burn-in test period T (s) is given by $$T=(t2-t1)\times(\tfrac{1}{2}-\alpha/\pi) \qquad (25)$$

where sin α=E10/E1. Accordingly, if the interval between the times t1 and t2 is set longer, then the burn-in test can be carried out for a longer time. Furthermore, since a reverse electric field is also placed on the gate oxide film, failures can be screened out much more effectively. Also, the current flows bidirectionally through the substrate of each of those devices. Thus, sufficient stress can be placed on lattice defects existing either in the substrate or around the substrate/gate electrode interface. Consequently, devices with failures can be screened out even more effectively.

Embodiment 4

Next, a fourth embodiment of the present invention will be described. In this embodiment, to carry out a burn-in test without degrading the normal gate oxide film 101b of any device on the wafer 101 shown in FIG. 4, the critical electric field E10 is not placed as a forward electric field on the gate oxide film 101b and no reverse electric field with an intensity exceeding a maximum allowable value is placed on the gate oxide film 101b.

The fourth embodiment is different from the third embodiment just in the way the control unit 103 shown in FIG. 4 controls the applied voltage. That is to say, the semiconductor wafer test system of the fourth embodiment also has the overall configuration shown in FIG. 4 and the detailed description thereof will be omitted herein. As for this fourth embodiment, it will be described with reference to FIG. 4 just how the control unit 103 controls the voltage applied to the conductive plate 100.

In the control unit 103, the power supply 104 applies voltage pulses, whose amplitude is proportional to the output signal S105 of the power supply controller 105, to the conductive plate 100. FIGS. 8A through 8E illustrate a situation where the electric field is created as pulses from the conductive plate 100. Supposing the maximum allowable reverse electric field that can be placed on the gate oxide film 101b of each device is E3 (V/m), the duty cycle Duty of each voltage pulse is set to $$Duty=E3/(E1+E3) \qquad (26)$$

Figure 8A:
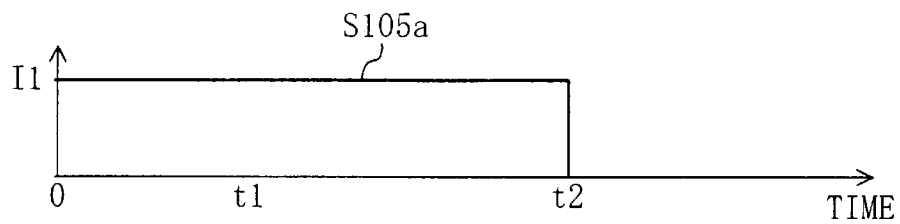
FIGS. 8A, 8B, 8C, 8D and 8E are timing diagrams illustrating the waveforms of reference current signal, current flowing, output signal of a tester, output signal of a power supply controller and electric field generated from a conductive plate, respectively, in a semiconductor wafer test system according to a fourth embodiment of the present invention.
Figure 8B:
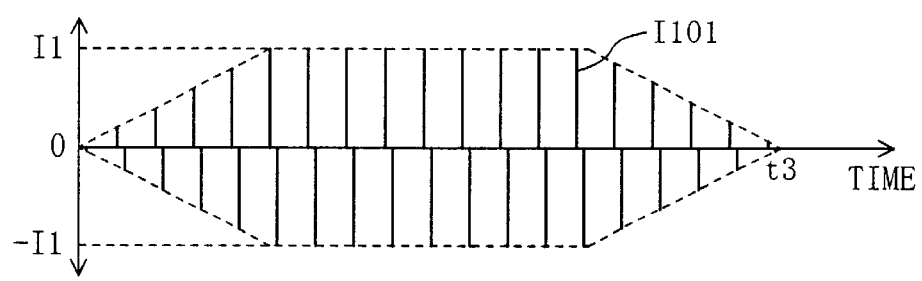
Figure 8C:
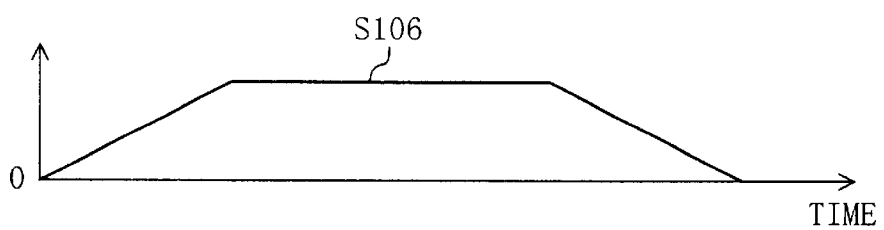
Figure 8D:
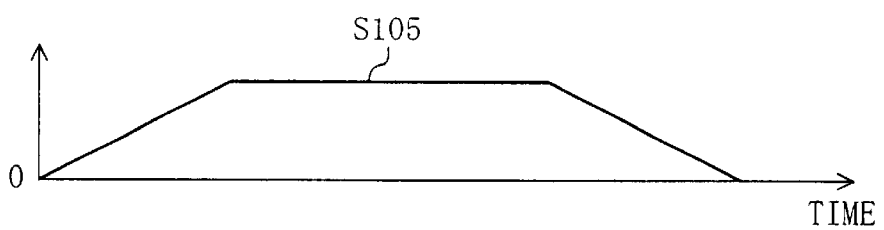
Figure 8E:
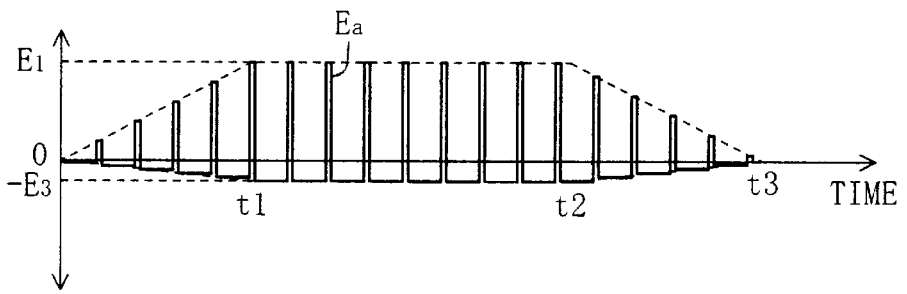

As shown in FIG. 8E, each interval in which the forward minimum required electric field E1 (V/m) is placed on the gate oxide film 101b is set shorter than each interval in which the reverse electric field E3 (V/m) is placed thereon. In the other respects, the test system of the fourth embodiment operates in the same way as the counterpart of the third embodiment.

It should be noted that the positive intensity of the forward electric field placed on the gate oxide film 101b is E1 (V/m), while the negative intensity of the reverse electric field is −E3 (V/m) as shown in FIG. BE. Thus, according to this embodiment, no reverse electric field with an intensity exceeding its maximum allowable value E3 (V/m) is placed on the gate oxide film 101b. Also, the electric field is placed as pulses on the gate oxide film 101b. So the electric field placed on the gate oxide film 101b does not have to be equal to the critical electric field E10 (V/m) but may be equal to the minimum required electric field E1 (V/m). Accordingly, there is no concern about the degradation of any normal gate oxide film 101b.

Embodiment 5

Figure 9:
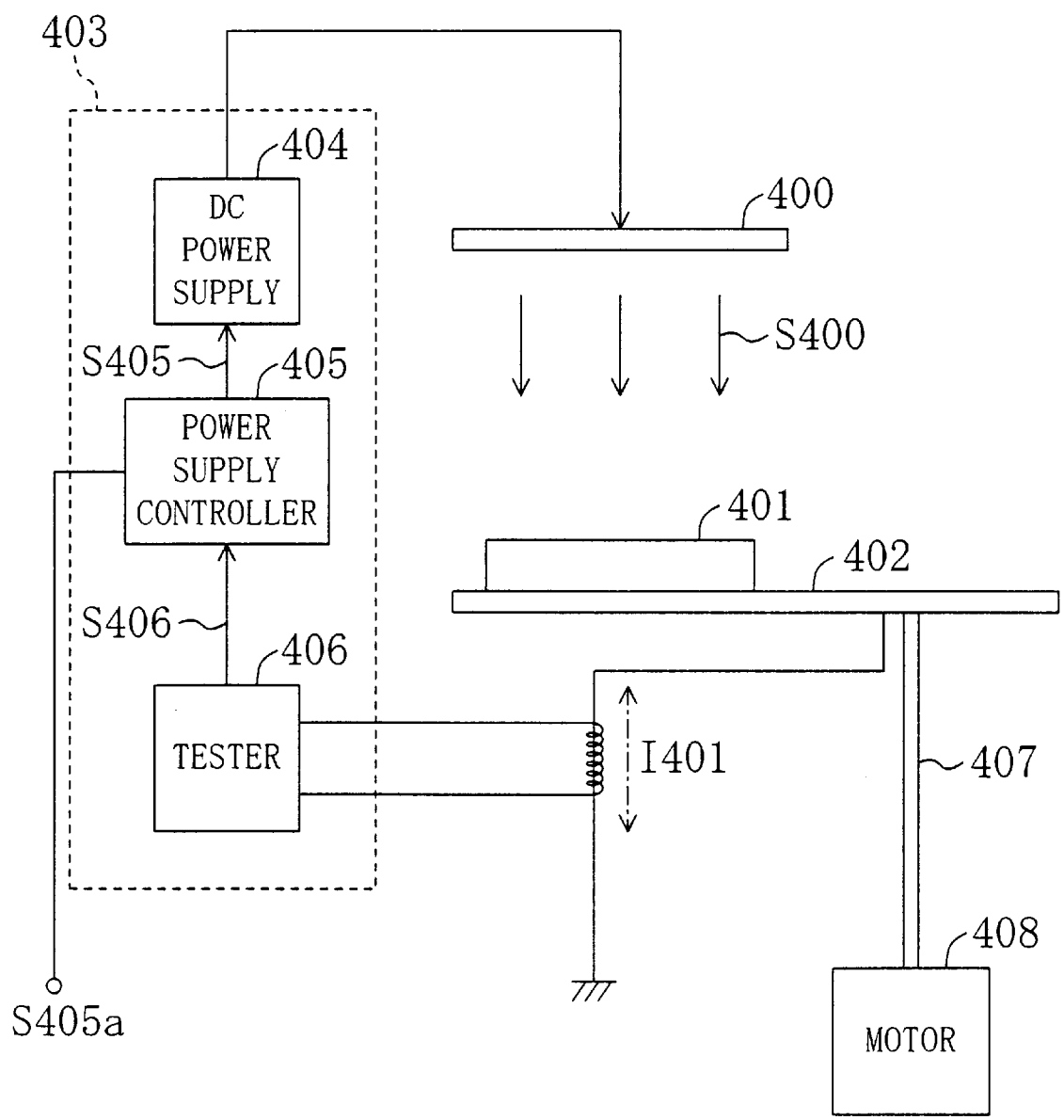
FIG. 9 illustrates an exemplary overall arrangement for a semiconductor wafer test system according to a fifth embodiment of the present invention.
Figure 10:
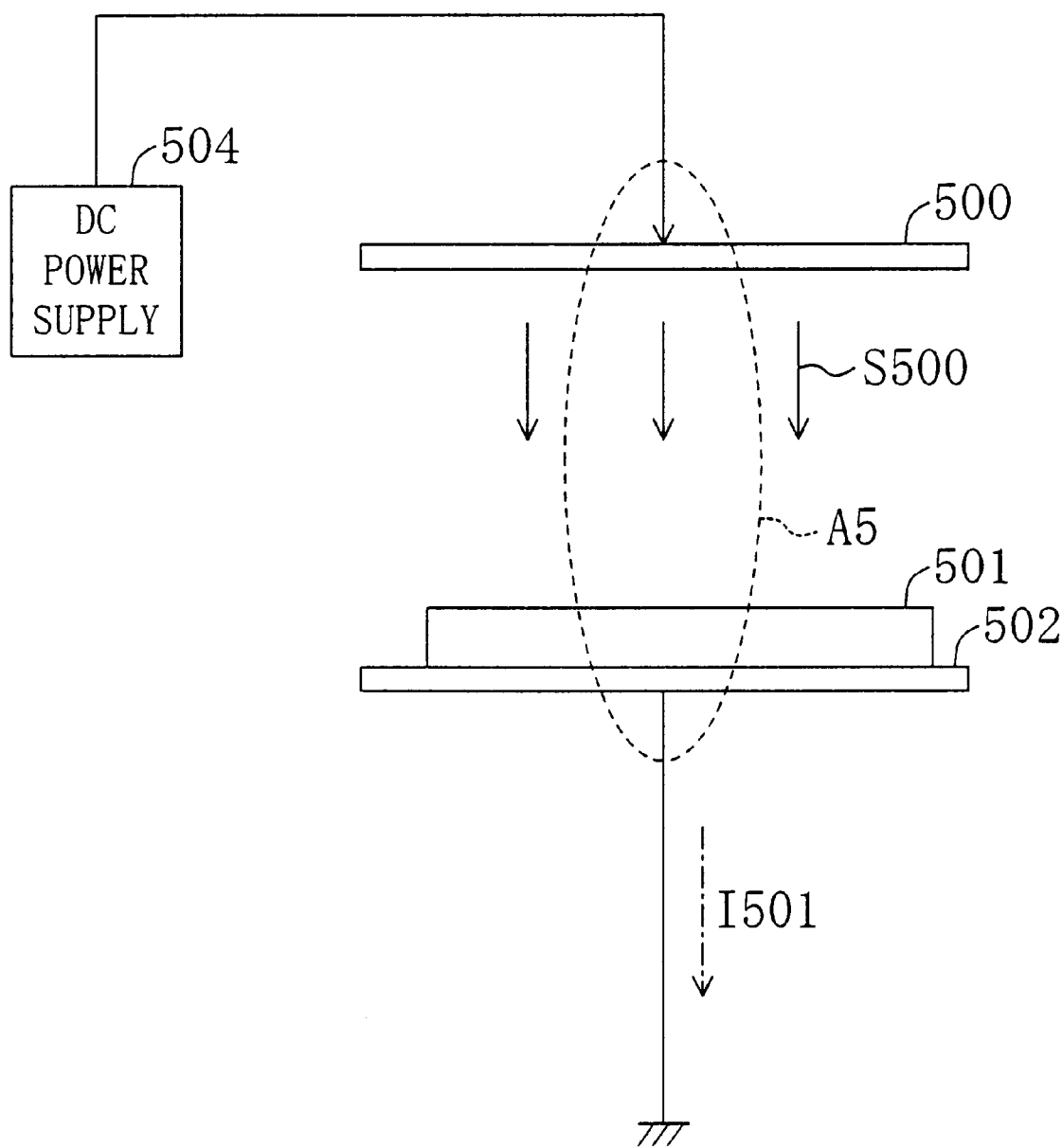
FIG. 10 illustrates an overall arrangement for a semiconductor wafer test system that I modeled.
Figure 11:
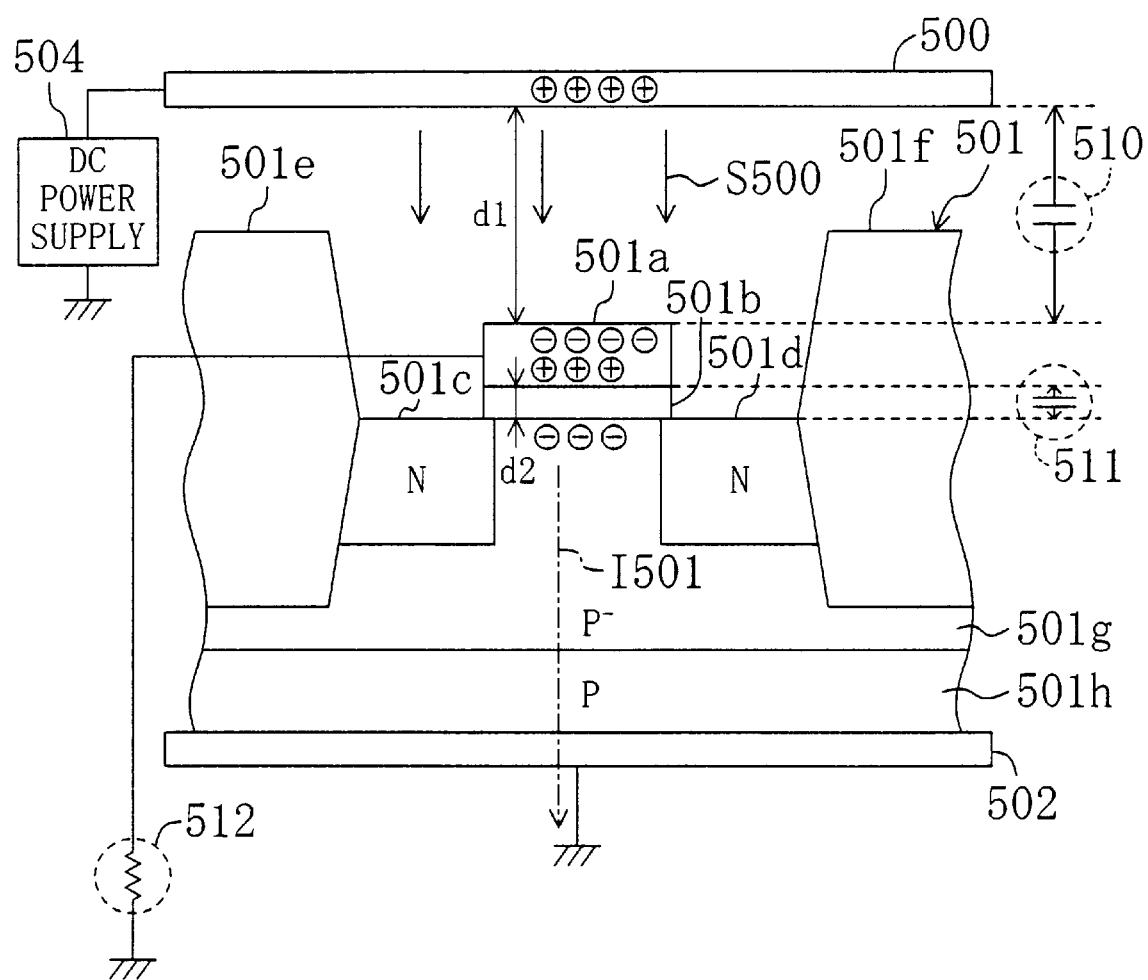
FIG. 11 is a cross-sectional view illustrating the main portion of a semiconductor device under test.
Figure 12:
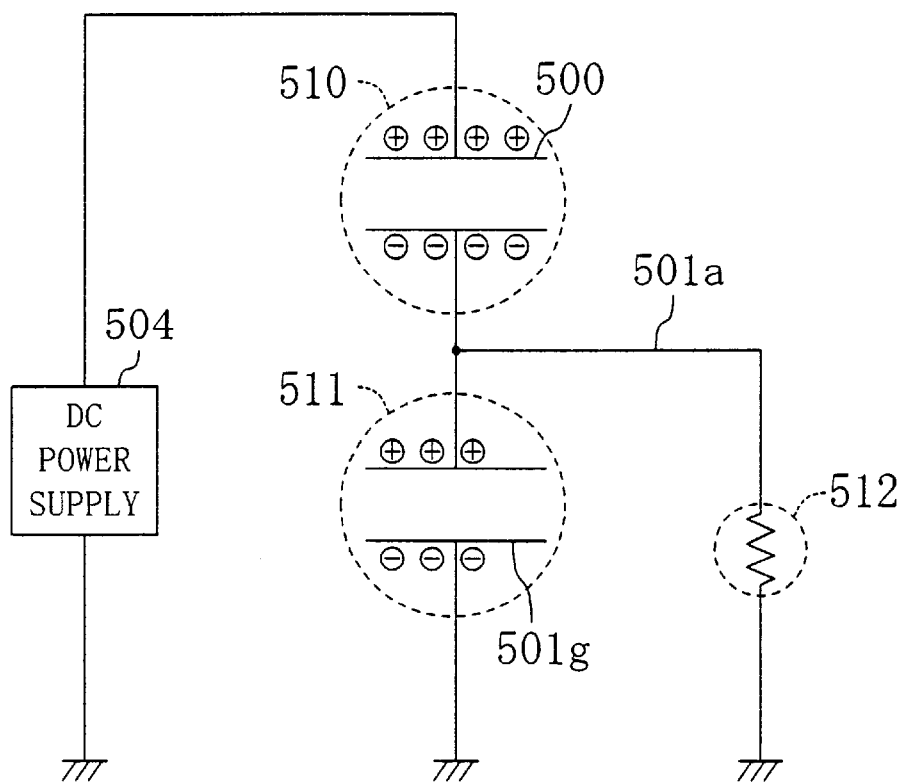
FIG. 12 is a schematic representation illustrating how the test system shown in FIG. 10 places an electric field stress on a semiconductor wafer under test.
Figure 13:
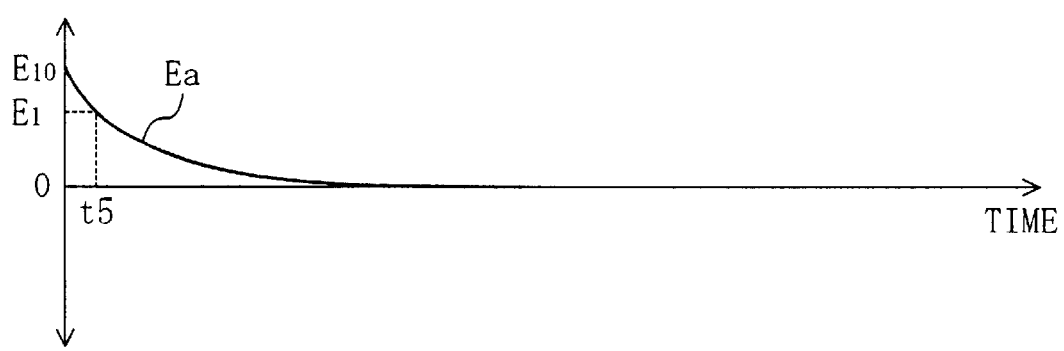
FIG. 13 is a graph illustrating how the electric field stress placed by the test system shown in FIG. 10 on the wafer under test changes with time.
Figure 14:
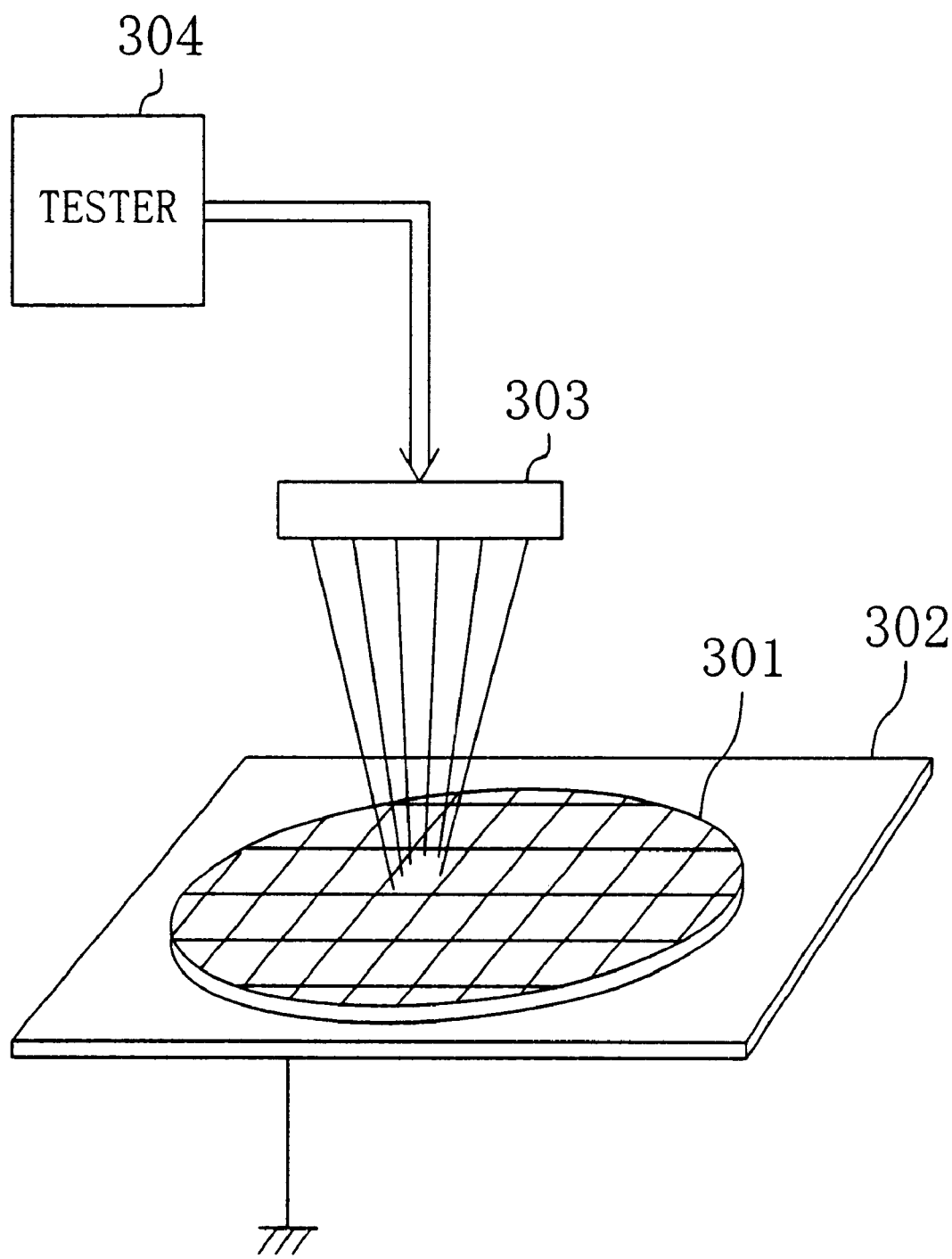
FIG. 14 illustrates an arrangement for a known semiconductor wafer test system.

Hereinafter, a fifth embodiment of the present invention will be described. FIG. 9 illustrates an exemplary overall arrangement for a semiconductor wafer test system according to the fifth embodiment. First, the respective elements of the system will be described.

As shown in FIG. 9, this test system is for use to carry out a burn-in test on a great number of semiconductor devices that have been formed on a semiconductor wafer 401 supported on a substrate plate 402. In this embodiment, the substrate plate 402 is secured to a drive shaft 407 so as to get driven by a motor 408. The test system further includes: conductive plate 400 for generating an electric field S400 to which the wafer 401 should be exposed; and control unit 403 for controlling a voltage to be applied to the conductive plate 400. The control unit 403 includes dc power supply 404, power supply controller 405 and tester 406. The power supply 404 applies a dc voltage to the conductive plate 400. The power supply controller 405 controls the power supply 404 by outputting a control signal S405 thereto and is controlled itself in response to a reference current signal S405a supplied thereto. The tester 406 measures a current I401 flowing between the substrate plate 402 and the ground, and outputs a signal S406 to the power supply controller 405.

In response to the output signal S405 of the power supply controller 405, the power supply 404 applies a dc voltage, whose amplitude is proportional to the output current S405, to the conductive plate 400. The conductive plate 400 generates an electric field S400 with an intensity proportional to the voltage applied from the power supply 404. If the current value represented by the output signal S406 of the tester 406 is smaller than the preset one represented by the reference current signal S405a, then the power supply controller 405 increases the level of its output signal S405. On the other hand, if the former current value is greater than the latter current value, then the power supply controller 405 decreases the level of its output signal S405. If these current values are equal to each other, the power supply controller 405 retains the level of its output signal S405. And in the initial state, the power supply controller 405 outputs zero as its output signal S405. The tester 406 measures the alternating current I401 flowing between the substrate plate 402 and the ground and outputs the amplitude of the current as its output signal S406 to the power supply controller 405.

The drive shaft 407 is horizontally spaced apart from the wafer 401, while the motor 408 rotates the drive shaft 407 at a constant angular velocity ω (rads/s). Accordingly, while the substrate plate 402 is being rotated by the motor 408 around the drive shaft 407, the wafer 401 is loaded and unloaded into/from the space, in which the electric field S400 created from the conductive plate 400 exists, at regular intervals.

Next, it will be described how the test system of the fifth embodiment operates. As described above, the wafer 401 is sufficiently spaced apart from the drive shaft 407. Accordingly, while the devices on the wafer 401 are passing under the conductive plate 400, the devices are exposed to the electric field S400. However, once the wafer 401 has gone out of the space under the conductive plate 400, the devices are exposed to no electric field at all.

Thus, if the ratio of the interval in which the wafer 401 exists inside the electric field S400 under the conductive plate 400 to the interval in which the wafer 401 is located outside of the electric field S400 is set to the predetermined ratio of $$E3/(E1+E3):E1/(E1+E3) \tag{27}$$

then a pulsed electric field will be placed on the devices as in the fourth embodiment.

Accordingly, if the reference current signal S405a is supplied in such a manner as to place the minimum required electric field E1 (V/m) on the gate oxide film during the burn-in test as in the fourth embodiment, then a predetermined stress will be placed on the devices. As a result, the burn-in test can be carried out as in the fourth embodiment.

In the third and fourth embodiments, an ac voltage should be applied to the conductive plate 100. In contrast, according to this fifth embodiment, a dc voltage may be applied to the conductive plate 400. This is because the electric field changes for the wafer 401 as the wafer 401 is rotated by the motor 408.

Thus, according to the fifth embodiment, even though a dc power supply is used as the power supply 404, the burn-in period can be changed using parameters other than the process constants. Also, no reverse electric field with an intensity exceeding the maximum allowable value will be placed on the gate oxide film. In addition, the voltage stress is applied as pulses, the electric field placed on the gate oxide film does not have to be equal to the critical electric field E10 (V/m) but may be the minimum required electric field E1 (V/m). Accordingly, there is no concern about the degradation of any normal gate oxide film.

Thus, the test system of the fifth embodiment can also change the burn-in period freely without changing the process constants. In addition, a reverse electric field is also placed on the devices, so devices with failures can be screened out much more effectively. Furthermore, sufficient stress can be placed on lattice defects existing either in the substrate or around the substrate/gate electrode interface. Consequently, devices with failures can be screened out even more effectively.

In the foregoing embodiments, the present invention has been described as being applied to an n-channel MOS transistor. Naturally, the present invention is equally applicable to a p-channel MOS transistor.

What is claimed is:

1. A system for carrying out a burn-in test on a great number of semiconductor devices that have been formed on a semiconductor wafer, each said device including a gate oxide film between a substrate and a gate electrode, the gate electrode being connected to a metal interconnect, wherein the system comprises electromagnetic wave generating means for exposing the wafer to an electromagnetic wave as an alternating current wave and placing an electric field with a predetermined intensity on the gate oxide film of each said device on the wafer, thereby carrying out the burn-in test on the devices.

2. The system of claim 1, further comprising:

stress sensing means for sensing a voltage stress imposed on the gate oxide film of each said device while the wafer is being exposed to the electromagnetic wave that has been generated by the electromagnetic wave generating means; and control means for controlling the intensity of the electric field, which is represented by the electromagnetic wave generated by the electromagnetic wave generating means, so that the voltage stress sensed by the stress sensing means falls within a preset threshold value range.

3. The system of claim 2, wherein the voltage stress, which has been sensed by the stress sensing means as being imposed on the gate oxide film, comprises a forward voltage stress and a reverse voltage stress, and wherein the control means controls the electric field intensity of the electromagnetic wave, generated by the electromagnetic wave generating means, so that the forward and reverse voltage stresses imposed on the gate oxide film fall within first and second preset threshold value ranges, respectively, the second range being lower than the first range.

4. A system for carrying out a burn-in test on a great number of semiconductor devices that have been formed on a semiconductor wafer, each said device including a gate oxide film between a substrate and a gate electrode, the gate electrode being connected to a metal interconnect, wherein the system comprises electric field generating means for exposing the wafer to an electric field as an alternating current wave and setting the electric field placed on the gate oxide film of each said device on the wafer to a predetermined intensity, thereby carrying out the burn-in test on the devices.

5. The system of claim 4, further comprising:

stress sensing means for sensing a voltage stress imposed on the gate oxide film of each said device while the wafer is being exposed to the electric field that has been generated by the electric field generating means; and control means for controlling the intensity of the electric field, generated by the electric field generating means, so that the voltage stress sensed by the stress sensing means falls within a preset threshold value range.

6. The system of claim 5, wherein the voltage stress, which has been sensed by the stress sensing means as being imposed on the gate oxide film, comprises a forward voltage stress and a reverse voltage stress, and wherein the control means controls the intensity of the electric field, generated by the electric field generating means, so that the forward and reverse voltage stresses imposed on the gate oxide film fall within first and second preset threshold value ranges, respectively, the second range being lower than the first range.

7. A system for carrying out a burn-in test on a great number of semiconductor devices that have been formed on a semiconductor wafer, each said device including a gate oxide film between a substrate and a gate electrode, the gate electrode being connected to a metal interconnect, the system comprising:

electric field generating means including a conductive plate for exposing the wafer to an electric field as a direct current wave, the generating means setting the electric field placed on the gate oxide film of each said device on the wafer to a predetermined intensity; and driving means for loading and unloading the wafer into/ from a space where the electric field, generated from the conductive plate, exists, whereby the wafer is exposed to an alternating-current electric field to carry out the burn-in test on the devices.

8. The system of claim 7, wherein the driving means loads and unloads the wafer into/from the space so that a ratio of a period, during which the wafer stays inside the electric field generated from the conductive plate, to a period, during which the wafer stays outside of the electric field, meets a predetermined value.

9. The system of claim 8, wherein the predetermined ratio is given by $$E2/(E1+E2):E1/(E1+E2)$$

where E1 and E2 are respective intensities of forward and reverse electric fields placed on the gate oxide film of each said device.

10. A system for performing a burn-in test on a plurality of semiconductor devices formed on a semiconductor wafer, each said device including a gate oxide film disposed between a substrate and a gate electrode, the gate electrode being connected to a metal interconnect, said system comprising an electromagnetic wave generator for generating an electromagnetic wave comprising an alternating current, said electromagnetic wave generator radiating said electromagnetic wave on said wafer so as to induce an electric field with a predetermined intensity on the gate oxide film of each said device on the wafer.

* * * * *